(12) United States Patent
Lee et al.

(10) Patent No.: US 9,196,709 B2
(45) Date of Patent: Nov. 24, 2015

(54) METHODS FOR FORMING SEMICONDUCTOR REGIONS IN TRENCHES

(71) Applicant: Taiwan Semiconductor Manufacturing Company, Ltd., Hsin-Chu (TW)

(72) Inventors: Yi-Jing Lee, Hsin-Chu (TW);
Cheng-Hsien Wu, Hsin-Chu (TW);
Chih-Hsin Ko, Fongshan (TW);
Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 271 days.

(21) Appl. No.: 13/794,703

(22) Filed: Mar. 11, 2013

(65) Prior Publication Data

US 2014/0220751 A1    Aug. 7, 2014

Related U.S. Application Data

(63) Continuation-in-part of application No. 13/757,615, filed on Feb. 1, 2013.

(51) Int. Cl.
*H01L 29/66* (2006.01)
*H01L 21/02* (2006.01)

(52) U.S. Cl.
CPC ..... *H01L 29/66795* (2013.01); *H01L 21/02647* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,799,592 | B2 * | 9/2010 | Lochtefeld | 438/44 |
| 2006/0169987 | A1 * | 8/2006 | Miura et al. | 257/79 |
| 2007/0190758 | A1 * | 8/2007 | Kaeding et al. | 438/510 |
| 2010/0012976 | A1 * | 1/2010 | Hydrick et al. | 257/190 |
| 2011/0079829 | A1 * | 4/2011 | Lai et al. | 257/288 |
| 2012/0025201 | A1 * | 2/2012 | Wann et al. | 257/76 |
| 2012/0211803 | A1 * | 8/2012 | Wu et al. | 257/200 |

OTHER PUBLICATIONS

Saha, Chumki and Das, S. and Ray, S. K. and Lahiri, S. K., Ion assisted growth and characterization of polycrystalline silicon and silicon-germanium films, Journal of Applied Physics, 83, 4472-4476 (1998).*

* cited by examiner

*Primary Examiner* — Mark Tornow
(74) *Attorney, Agent, or Firm* — Slater & Matsil, L.L.P.

(57) ABSTRACT

A method includes recessing a portion of a semiconductor substrate between opposite isolation regions to form a recess. After the step of recessing, the portion of the semiconductor substrate includes a top surface. The top surface includes a flat surface, and a slant surface having a (111) surface plane. The slant surface has a bottom edge connected to the flat surface, and a top edge connected to one of the isolation regions. The method further includes performing an epitaxy to grow a semiconductor material in the recess, wherein the semiconductor material is grown from the flat surface and the slant surface, and performing an annealing on the semiconductor material.

19 Claims, 6 Drawing Sheets

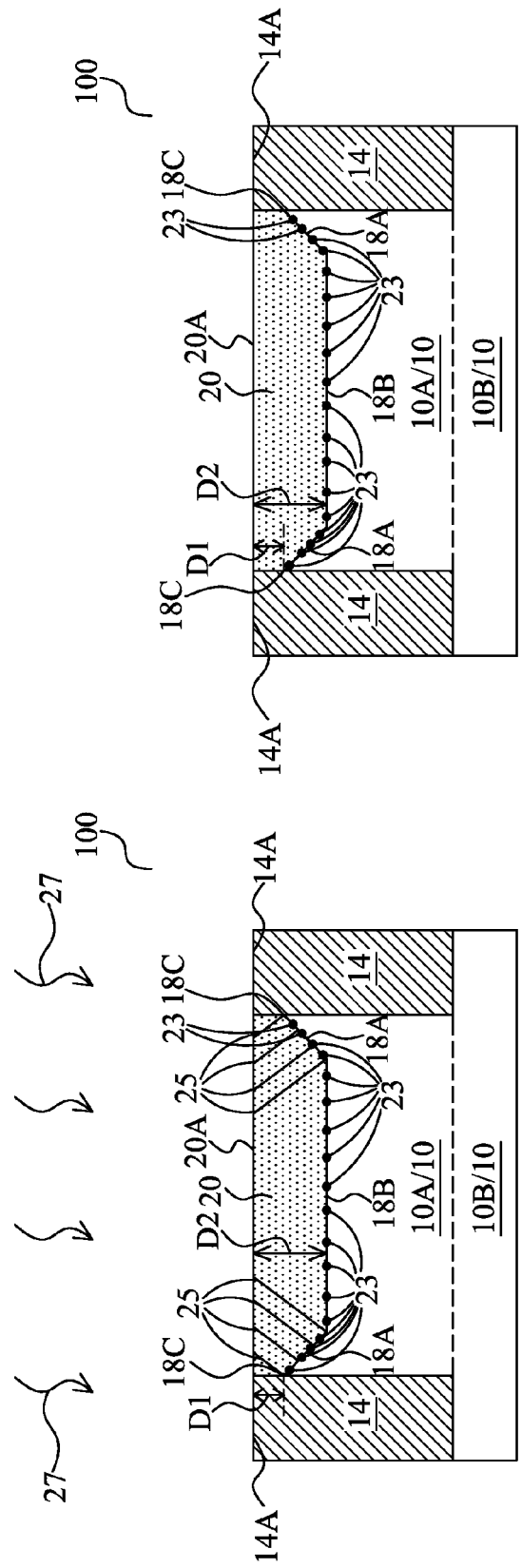

METHODS FOR FORMING SEMICONDUCTOR REGIONS IN TRENCHES

This application is a continuation-in-part application of the following commonly-assigned U.S. patent application: application Ser. No. 13/757,615, filed Feb. 1, 2013, and entitled "Methods for Forming Semiconductor Regions in Trenches," which application is hereby incorporated herein by reference.

BACKGROUND

The speeds of metal-oxide-semiconductor (MOS) transistors are closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high. Germanium, silicon germanium, and compound semiconductor materials of group III and group V elements (referred to as III-V compound semiconductors hereinafter) are thus good candidates for forming their high electron mobility and/or hole mobility.

A current problem posted to using germanium, silicon germanium, and III-V compound semiconductor in the integrated circuit formation processes is the difficulty in the formation of the thin films of these semiconductor materials. Currently, there is no feasible bulk growth method. Therefore, germanium, silicon germanium, and III-V compound semiconductors are commonly formed by epitaxially growing films on substrates such as Si or SiC substrates. The existing available substrate materials, however, do not have lattice constants and thermal expansion coefficients closely matching that of III-V compound semiconductors. For example, the lattice constant of silicon is about 5.43 Å, the lattice constant of germanium is about 5.66 Å, while the lattice constant of GaAs, which is a commonly used III-V compound semiconductor, is 5.65 Å. As a result, the resulting germanium-containing semiconductors and III-V compound semiconductors grown from other substrates suffer from high defect densities. Various methods were thus explored to reduce the defect densities in the grown semiconductors. A known method is to form recesses in shallow trench isolation regions, and then grow the germanium, silicon germanium, or III-V compound semiconductors in the recesses. Although the semiconductors formed using this method generally have lower defect densities than what are grown from blanket silicon wafers, the defect densities were still often high.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 9 are cross-sectional views of intermediate stages in the manufacturing of a Fin Field-Effect Transistor (FinFET) in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method of forming semiconductor materials through epitaxy re-growth in trenches is provided. The intermediate stages of forming a semiconductor fin and the respective FinFET formed on the semiconductor fin are illustrated in accordance with some embodiments. The variations of the re-growth methods in accordance with some embodiments are then discussed. Throughout the various views and illustrative embodiments, like reference numbers are used to designate like elements.

Figure 1:
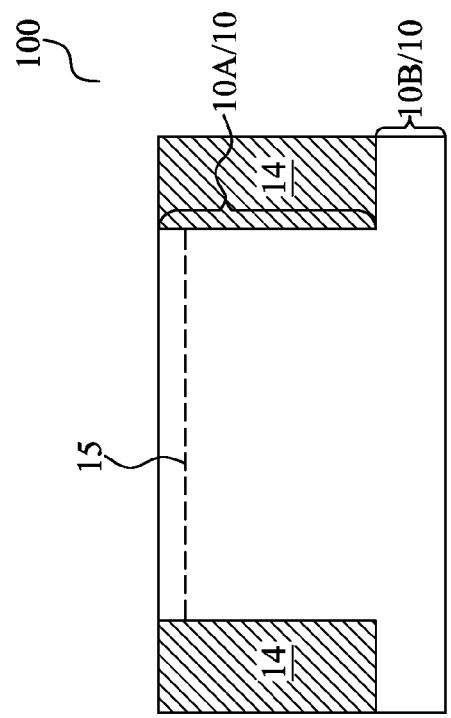

FIGS. 1 through 8 illustrate the cross-sectional views of intermediate stages in the formation of a semiconductor fin and a Fin Field-Effect Transistor (FinFET) in accordance with exemplary embodiments. Referring to FIG. 1, substrate 10, which is a part of semiconductor wafer 100, is provided. Substrate 10 may be a silicon substrate, although it may also be formed of other materials such as germanium, SiC, SiGe, GaAs, sapphire, or the like. Substrate 10 may have a (001) top surface, which is also known as (100) surface. Isolation regions such as Shallow Trench Isolation (STI) regions 14 are formed in substrate 10. Substrate 10 thus includes portions 10A between STI regions 14, and portions 10B under STI regions 14. The formation process of STI regions 14 may include etching substrate 10 to form recesses (occupied by STI regions 14), filling the recesses with a dielectric material(s), and performing a planarization (such as a Chemical Mechanical Polish (CMP)) to remove excess dielectric materials. The remaining portions of the dielectric material(s) form STI regions 14. In some embodiments, STI regions 14 comprise silicon oxide.

Portion 10A of substrate 10 is between STI regions 14, with the sidewalls of portion 10A contacting STI regions 14. In some embodiments, portion 10A comprises a silicon region free from germanium. Alternatively, portion 10A comprises silicon germanium, pure germanium, or a compound semiconductor comprising group III and group V elements (referred to as III-V compound semiconductors hereinafter). In FIG. 1, although the top surface of portion 10A is shown as being level with the top surfaces of STI regions 14, the top surface of portion 10A may also be lower than the top surfaces of STI regions 14 due to the removal of a hard mask (not shown, may be silicon nitride) and a pad oxide (not shown). Dashed line 15 is drawn to schematically illustrate the respective top surface of portion 10A.

Figure 2:
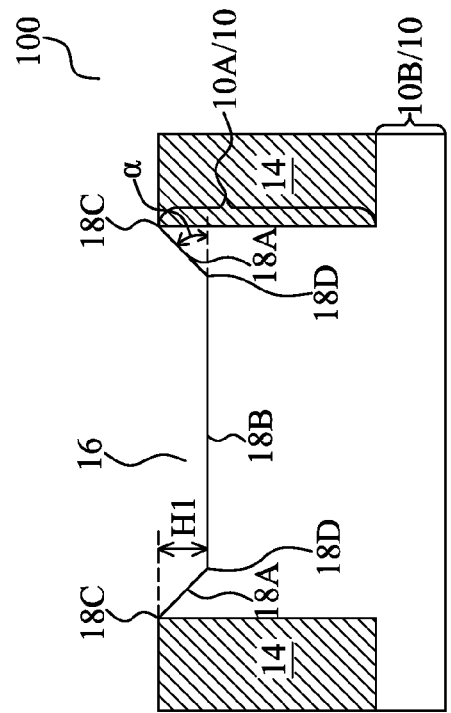

Next, as shown in FIG. 2, a top part of portion 10A is etched to form trench 16. In some embodiments, the etching is performed through an isotropic etching such as wet etching, for example, using ammonia ($NH_3$), Tetra-Methyl Ammonium Hydroxide (TMAH), a potassium hydroxide (KOH) solution, or the like, as an etchant. As a result of the etching process, slant surfaces 18A are formed as parts of the top surfaces of portion 10A. In some embodiments, slant surfaces 18A are (111) surfaces on (111) surface planes. Portion 10A further includes flat surface 18B connected to the bottom edges 18D of (111) surfaces 18A, wherein edges 18D are also the end edges of flat surface 18B. In some embodiments, substrate 10 has a (001) top surface plane, and hence flat surface 18B also has a (001) surface plane. Tilt angle α of slant surfaces 18A, which tilt angle is also formed between surfaces 18A and 18B, is thus about 54.7 degrees.

In the etching steps, process conditions are adjusted, so that the (111) surfaces 18A have large areas. Height H1 of surfaces 18A may be greater than about 20 nm, wherein height H1 is measured from top edge 18C to the bottom edge 18D of surface 18A. In some embodiments, to increase the area of (111) surfaces 18A, the concentration (or percentage) of the etching solution is adjusted. For example, when TMAH is used, the concentration of TMAH in the etching solution may be lower than about 30 weight percent. When ammonia is used, the concentration of ammonia in the etching solution may be between about 5 weight percent and about 95 weight percent. Alternatively or simultaneously, to increase the area of (111) surfaces 18A, the temperature of the etching solution is adjusted. In some embodiments, the temperature of the etching solution is between about 28° C. and about 100° C. The various factors including the type of chemicals in the etching solution, the concentration of the chemicals in the etching solution, and the temperature in combination affect the area of (111) surfaces 18A, and the change of one factor may need the adjustment of other factors in order to generate a large area of (111) surfaces 18A.

In some embodiments, in the beginning stage of the etching, the middle region of portion 10A is etched down, so that flat surface 18B is formed. With the proceeding of the etching process, flat surface 18B is lowered, and (111) surfaces 18A grow in sizes. Top edges 18C of (111) surfaces 18A, however, may not be lowered in the beginning stage of the etching process. Top edges 18C may be the joint points of (111) surfaces 18A and STI regions 14. With further etching of portion 10A, top edges 18C may start to be lowered, and the resulting structure is shown in FIG. 3.

Figure 3:
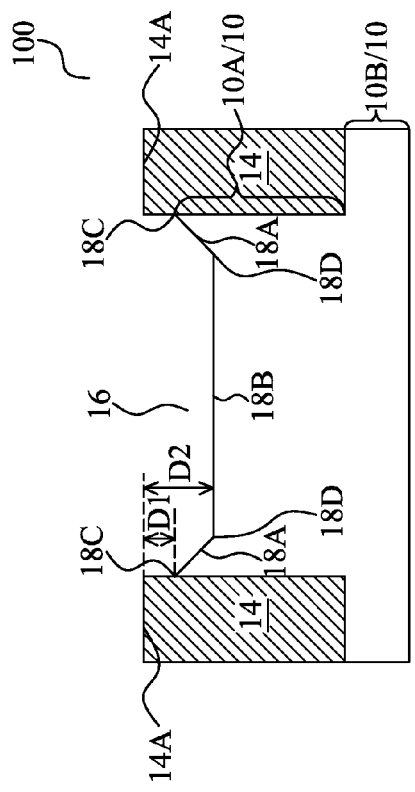

FIG. 3 illustrates the continued etching of portion 10A, so that top edges 18C of surfaces 18A are lowered with the proceeding of the etching process. Throughout the description, the depths of top edges 18C, which depths are measured from top surfaces 14A of STI regions 14 to top edges 18C, are referred to as depth D1. The depth of flat surface 18B, which depth is measured from top surfaces 14A of STI regions 14, is referred to as depth D2. In the continued etching, the areas of (111) surfaces 18A may continue to grow, or may remain substantially unchanged.

Figure 4A:
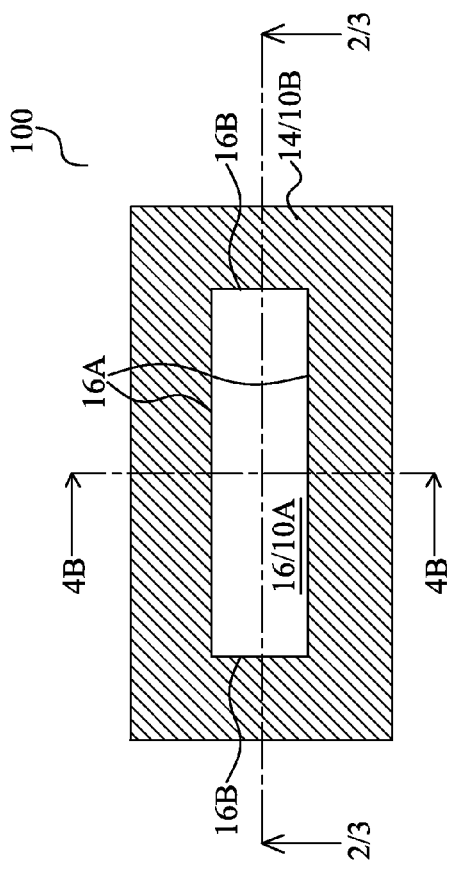
Figure 4B:
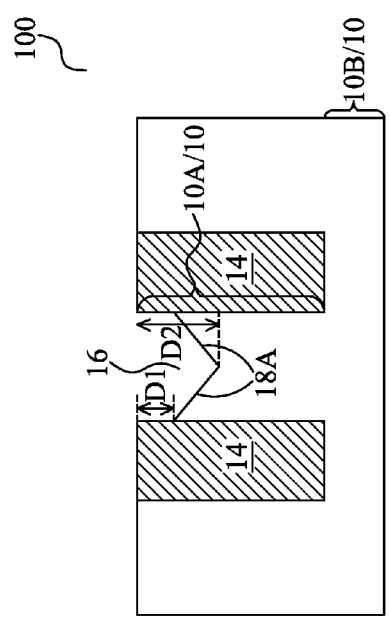

FIGS. 4A and 4B illustrate a top view and a cross-sectional view, respectively, of the structures shown in FIGS. 2 and 3. The cross-sectional views in FIGS. 2 and 3 may be obtained from the plane crossing line 2/3-2/3 in FIG. 4A. The cross-sectional view in FIG. 4B may be obtained from the plane crossing line 4B-4B in FIG. 4A. In some embodiments, as shown in FIG. 4A, trench 16 comprises long side(s) 16A and short side(s) 16B shorter than long side 16A. Short side 16B of trench 16 may extend along, and parallel to, a <1-10> direction of substrate 10 and a <-110> direction, wherein the <-110> direction is the opposite direction of the <1-10> direction. Long side 16A of trench 16 extends along, and parallel to, the <110> direction and the <-1-10> direction of substrate 10. In some embodiments, in the plane that is parallel to the short side 16B, as shown in FIG. 4B, (111) surfaces 18A merge with each other, and hence trench 16 has a V-shaped bottom. As a comparison, in the plane that is parallel to long side 16A, as shown in FIGS. 2 and 3, two (111) surfaces 18A appear to be separated from each other by flat surface 18B.

Figure 5:
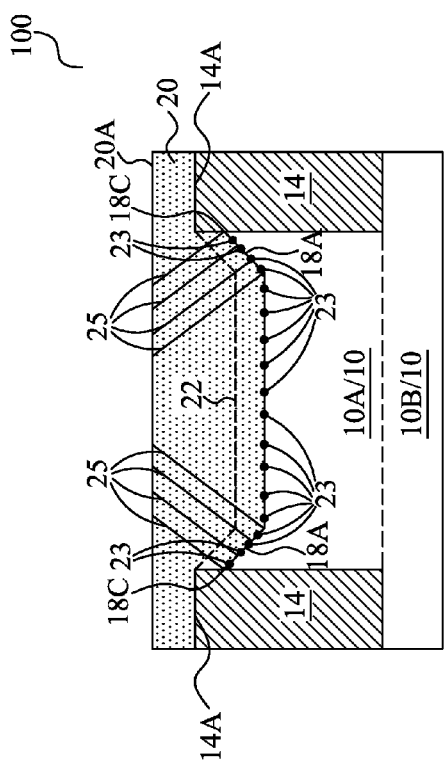

Referring to FIG. 5, an epitaxy is performed, and semiconductor region 20 is regrown in trench 16 (FIG. 3). Top surfaces 18A and 18B of substrate portion 10A thus become the interfaces between substrate portion 10A and semiconductor region 20. In some embodiments, semiconductor region 20 is re-grown from the structure in FIG. 2, in which the top edges 18C of (111) surfaces 18A are not lowered when flat surface 18B is lowered. The respective structure is similar to what is shown in FIG. 5, except that the bottom of semiconductor region 20 is at the position illustrated by dashed line 22. In alternative embodiments, the re-growth of semiconductor region 20 is performed on the structure in FIG. 3, in which top edges 18C of (111) surfaces 18A are lowered. The resulting structure is shown in FIG. 5.

In some embodiments, semiconductor region 20 comprises silicon germanium, with the atomic percentage of germanium greater than zero percent, and equal to or smaller than 100 percent. When the atomic percentage of germanium is 100 percent, semiconductor region 20 is formed of pure germanium. In the embodiments wherein semiconductor region 20 comprises silicon germanium, the upper portions may have greater germanium percentages than lower portions. In alternative embodiments, semiconductor region 20 comprises a III-V compound semiconductor material selected from InAs, AlAs, GaAs, InP, GaN, InGaAs, InAlAs, GaSb, AlSb, AlP, GaP, and combinations thereof. Semiconductor region 20 may be a homogenous region, with the bottom portions and the top portions formed of a same material and having the same compositions of elements. Semiconductor region 20 may also be a composite region, with bottom portions and top portions comprising different materials or having different compositions. For example, the upper portions of semiconductor region 20 may have greater lattice mismatches with substrate 10 than lower portions.

Since substrate 10 and semiconductor region 20 have different lattice constants, misfits occur at the interface between substrate 10 and semiconductor region 20, which misfits are schematically illustrated as 23. Stacking faults 25 (which are also parts of the misfits) also grow with the growth of semiconductor region 20. Stacking faults 25 may grow in the <111> direction of semiconductor region 20. Stacking faults 25 occur in trench 16 (FIG. 3), and may further grow into the portion of semiconductor region 20 over trench 16.

The epitaxy is continued until the top surface 20A of semiconductor region 20 is higher than top surfaces 14A of STI regions 14. A planarization is then performed to remove excess portions of semiconductor region 20, which excess portions are over top surfaces 14A of STI regions 14. The planarization may comprise a Chemical Mechanical Polish (CMP). In the resulting structure, top surface 20A of semiconductor region 20 is level with top surfaces 14A of STI regions 14. Top surface 20A of semiconductor region 20 may be a (001) surface. The depth D1 of top edges 18C and depth D2 of flat surface 18B are also marked in FIG. 6. In these embodiments, depth D1 is the depth (of top edges 18C) measured from the top surface 20A of semiconductor region 20, and depth D2 is the depth (of flat surface 18B) measured from the top surface 20A of semiconductor region 20.

Referring again to FIG. 6, an anneal (symbolized by arrows 27) is performed on wafer 100 to eliminate, or at least reduce, stacking faults 25 in semiconductor region 20. The resulting structure is shown in FIG. 7, in which stacking faults 25 (FIG. 6) are at least reduced, and may be substantially eliminated. The remaining misfits, as shown as 23, are hence limited to the region close to the interface between substrate 10 and semiconductor region 20, and do not extend to upper regions of semiconductor region 20.

In some embodiments, the anneal is performed in an ambient filled with a process gas comprising nitrogen ($N_2$), although additional gases such as hydrogen ($H_2$) may also be added. The pressure of the process gas may be between about 30 torr and about 760 torr. In some embodiments, the temperature of the annealing is between about 800° C. and about 900° C. Experiment results indicated that within this range of the annealing temperature, the effect of eliminating stacking faults is maximized. When the annealing temperature is out of this range, the effect is at least reduced.

In addition, experiment results also indicated that the effect of reducing the stacking faults is related to the profile of trench 16 (FIG. 3), including, for example, ratio D1/D2 and the areas of (111) surfaces 18A. When ratio D1/D2 is about 0.6 or smaller and that the areas of (111) surfaces 18A are large, the anneal may result in a significant reduction in defect density. Conversely, when ratio D1/D2 is greater than 0.6 (for example, greater than about 0.65) and/or the areas of (111) surfaces 18A are small, the annealing has little effect in the reduction of stacking faults even if the same anneal conditions are used. Hence, adjusting the profile of trench 16 combined with the annealing may achieve a maximized result in the reduction of stacking faults.

Additional experiments were also performed to anneal semiconductor region 20 after it growth. In these experiments, the annealing was performed before the CMP (shown in FIG. 6) was performed. The experiments indicated that although the annealing may result in the reduction of stacking faults, the germanium atoms in semiconductor region 20 may aggregate, resulting in a non-uniform germanium distribution.

Figure 9:
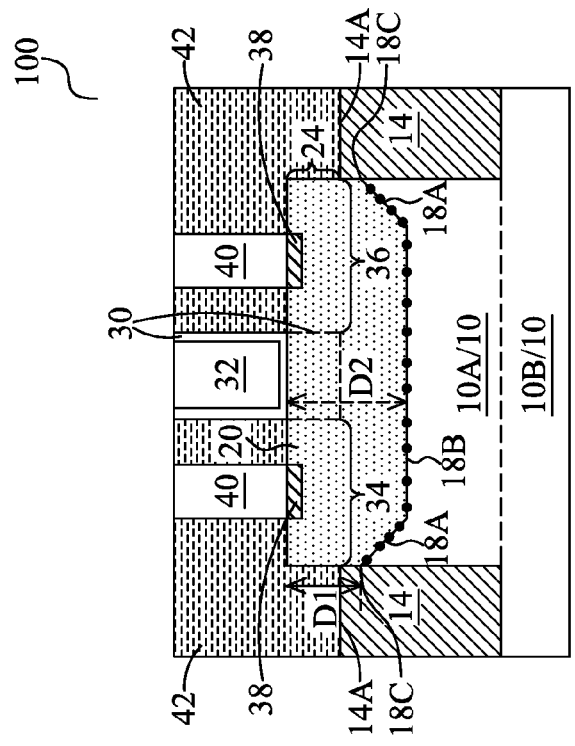
Figure 8:
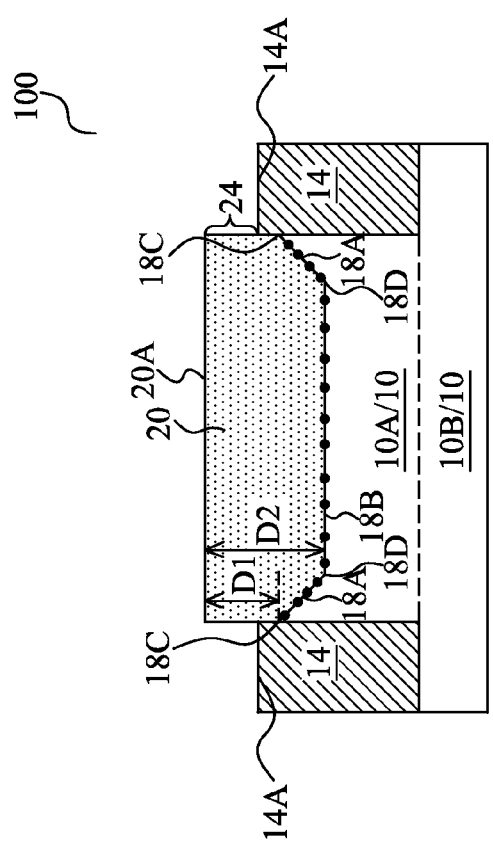

Field-Effect Transistors (FETs) may then be formed on semiconductor region 20. For example, FIGS. 8 and 9 illustrate the cross-sectional views in the formation of Fin Field-Effect Transistor (FET) 26 in accordance with some embodiments. Referring to FIG. 8, STI regions 14 are recessed, for example, through an etching step. A top portion of semiconductor region 20 is thus higher than top surfaces 14A of STI regions 14. This portion of semiconductor strip region 20 forms semiconductor fin 24, which may be used to form FinFET 26, as shown in FIG. 9. In some embodiments, top surfaces 14A of STI regions 14 are higher than flat surface 18B, and may be higher than top edges 18C.

Referring to FIG. 9, gate dielectric 30 and gate electrode 32 are formed. Other components of FinFET 26 including source region 34, drain region 36, source and drain silicide regions 38, source and drain contact plugs 40, and Inter-Layer Dielectric (ILD) 42 are also formed. Gate dielectric 30 may be formed of a dielectric material such as silicon oxide, silicon nitride, an oxynitride, multi-layers thereof, and combinations thereof. Gate dielectric 30 may also comprise high-k dielectric materials. The exemplary high-k materials may have k values greater than about 4.0, or even greater than about 7.0. Gate electrode 32 may be formed of doped polysilicon, metals, metal nitrides, metal silicides, or the like. The illustrated gate dielectric 32 and gate electrode 32 have a gate-last structure, in which gate dielectric 30 and gate electrode 32 are formed after the formation of ILD 42. Accordingly, gate dielectric 30 comprises vertical portions between gate electrode 32 and ILD 42. In alternative embodiments, the gate dielectric and the gate electrode of FinFET 26 may also have a gate-first structure.

The resulting FinFET 26 as in FIG. 9 may also include semiconductor region 20 and the underlying substrate portion 10A. Furthermore, depths D1 and D2 are marked, wherein the details of top surfaces 18A and 18B (which are also interfaces) and depths D1 and D2 are essentially the same as in FIGS. 3 through 5, and are not repeated herein.

Figure 10:
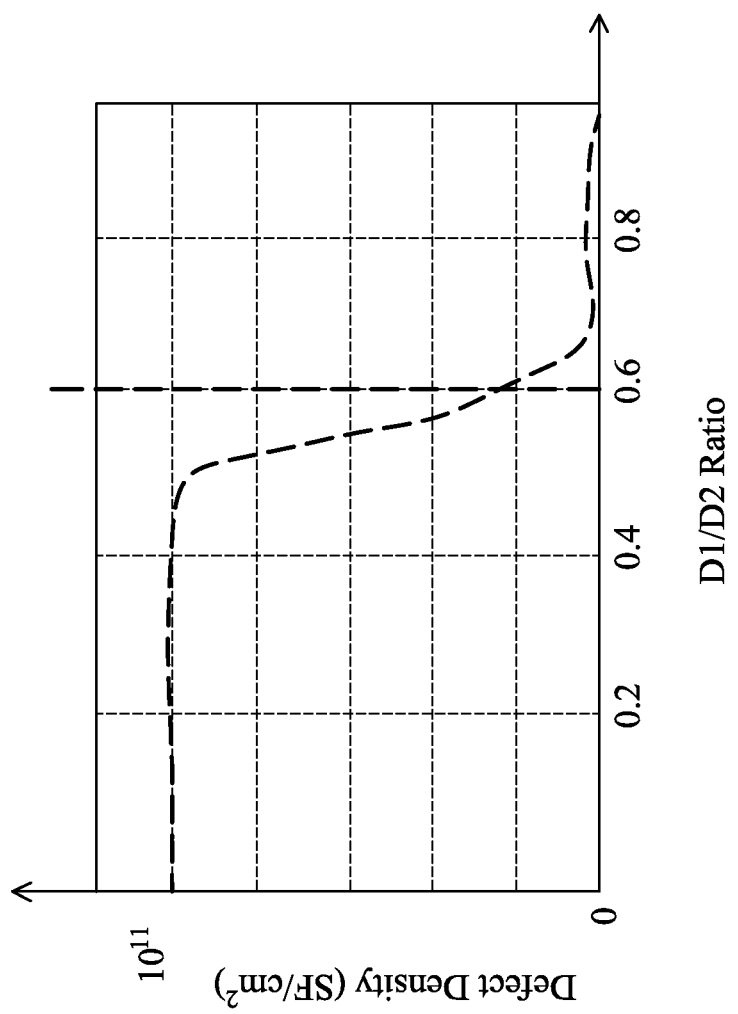
FIG. 10 illustrates the defect density in epitaxy regions as a function of a ratio of depths of recesses, in which the epitaxy regions are grown.

The performance of FinFET 26, such as the drive current Ion and the leakage currents, is related to the quality of re-grown semiconductor region 20 (FIGS. 5-9). It is preferred that the defects such as dislocations and stacking faults in semiconductor region 20 are as fewer as possible. Experiment results performed on sample silicon wafers revealed that the defect density in semiconductor region 20 is related to the area of (111) surfaces 18A, and the increase in the area of (111) surfaces 18A results in the reduction of the defect density in semiconductor region 20, and vice versa. When there is no (111) surfaces 18A formed, which means that D1 is equal to D2, the defect density is very high. The increase in the area of (111) surfaces 18A also means that the ratio D1/D2 is increased. FIG. 10 illustrates the defect (the stacking fault) density as a function of D1/D2 ratio. As shown in FIG. 10, when D1/D2 ratio is smaller than about 0.5, the defect density is high, and starts dropping significantly when D1/D2 ratio is about 0.5. When D1/D2 ratio is about 0.6 or smaller, the defect density is dropped to a very low level, and starts to stabilize. FIG. 10 also illustrates that when D1/D2 is close to about 0.7, the defect density has been stabilized at a low level. Secondary Electron Microscope (SEM) images of the regrown semiconductor regions from trenches revealed that when D1/D2 ratio is about 0.6 or smaller, the defects are confined close to interfaces 18B, and did not grow substantially with the further growth of semiconductor region 20. Accordingly, in accordance with the embodiments, as shown in FIG. 3, D1/D2 ratio is controlled to be smaller than about 0.6 in order to have a defect density. In addition, height H1 of (111) surfaces 18A may be greater than about 20 nm to maintain a low defect density. Furthermore, by performing nitrogen annealing on semiconductor region 20, the already low defects may be further reduced, and stacking faults may be substantially eliminated.

In accordance with some embodiments, a method includes recessing a portion of a semiconductor substrate between opposite isolation regions to form a recess. After the step of recessing, the portion of the semiconductor substrate includes a top surface. The top surface includes a flat surface, and a slant surface having a (111) surface plane. The slant surface has a bottom edge connected to the flat surface, and a top edge connected to one of the isolation regions. The method further includes performing an epitaxy to grow a semiconductor material in the recess, wherein the semiconductor material is grown from the flat surface and the slant surface, and performing an annealing on the semiconductor material.

In accordance with other embodiments, a method includes recessing a portion of a semiconductor substrate between opposite isolation regions to form a recess. After the step of recessing, the portion of the semiconductor substrate has a top surface, which includes a flat surface, and a slant surface having a (111) surface plane connected to the flat surface. An epitaxy is performed to grow a semiconductor material in the recess, wherein the semiconductor material is grown from the flat surface and the slant surface. A planarization is performed to level a top surface of the semiconductor material with top surfaces of the isolation regions. An annealing is on the semiconductor material. The annealing is performed at a temperature between about 800° C. and about 900° C., with nitrogen ($N_2$) as a process gas of the annealing.

In accordance with yet other embodiments, a method includes recessing a portion of a semiconductor substrate between opposite isolation regions to form a recess. After the step of recessing, the portion of the semiconductor substrate has a top surface comprising a flat surface, and a slant surface having a (111) surface plane. The slant surface has a bottom edge connected to the flat surface. The slant surface also has a top edge, wherein the top edge is at a first depth of the recess, and the bottom edge is at a second depth of the recess. The first depth and the second depth have a ratio smaller than about 0.6. An epitaxy is performed to grow a semiconductor material in the recess, wherein the semiconductor material is grown from the flat surface and the slant surface. A planarization is performed to level a top surface of the semiconductor material with top surfaces of the isolation regions. After the planarization, an annealing is performed on the semiconductor material. The annealing is performed at a temperature between about 800° C. and about 900° C., with nitrogen ($N_2$) as a process gas of the annealing.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   recessing a portion of a semiconductor substrate between opposite isolation regions to form a recess, wherein after the step of recessing, the portion of the semiconductor substrate comprises a top surface comprising:
   a flat surface; and
   a slant surface having a (111) surface plane, wherein the slant surface comprises a bottom edge connected to the flat surface, and a top edge connected to one of the isolation regions;
   performing an epitaxy to grow a semiconductor material in the recess, wherein the semiconductor material is grown from the flat surface and the slant surface;
   performing a planarization to level a top surface of the semiconductor material with top surfaces of the isolation regions;
   after the planarization, performing an annealing; and
   after the annealing, recessing the isolation regions, wherein a portion of the semiconductor material protrudes over the isolation regions to form a semiconductor fin, and wherein after the recessing the isolation regions, top surfaces of remaining portions of the isolation regions are higher than the top edge of the slant surface.

2. The method of claim 1, wherein the top edge is at a first depth of the recess, and the bottom edge is at a second depth of the recess, and wherein the first depth and the second depth have a ratio smaller than about 0.6.

3. The method of claim 1 further comprising performing a planarization to level a top surface of the semiconductor material with top surfaces of the isolation regions, wherein the annealing is performed after the planarization.

4. The method of claim 1, wherein the annealing is performed using nitrogen ($N_2$) as a process gas.

5. The method of claim 1, wherein the annealing is performed at a temperature between about 800° C. and about 900° C.

6. The method of claim 1, wherein the step of recessing the portion of the semiconductor substrate comprises etching the portion of the semiconductor substrate using an etching solution comprising Tetra-Methyl Ammonium Hydroxide (TMAH), and wherein a concentration of the TMAH is between about 5 percent and about 95 percent.

7. The method of claim 1 further comprising:
   forming a gate dielectric and a gate electrode on a middle portion of the semiconductor fin; and
   forming a source region and a drain region on opposite ends of the gate electrode, with each of the source region and the drain region comprising a portion of the semiconductor material.

8. The method of claim 1, wherein the semiconductor material comprises silicon germanium.

9. A method comprising:
   recessing a portion of a semiconductor substrate between opposite isolation regions to form a recess, wherein after the step of recessing, the portion of the semiconductor substrate comprises a top surface comprising:
   a flat surface; and
   a slant surface having a (111) surface plane connected to the flat surface;
   performing an epitaxy to grow a semiconductor material in the recess, wherein the semiconductor material is grown from the flat surface and the slant surface;
   performing a planarization to level a top surface of the semiconductor material with top surfaces of the isolation regions; and
   after the planarization, performing an annealing on the semiconductor material, wherein the annealing is performed at a temperature between about 800° C. and about 900° C., with nitrogen ($N_2$) as a process gas of the annealing.

10. The method of claim 9, wherein the slant surface comprises:
    a bottom edge connected to the flat surface; and
    a top edge, wherein the top edge is at a first depth of the recess, and the bottom edge is at a second depth of the recess, and wherein the first depth and the second depth have a ratio smaller than about 0.6.

11. The method of claim 9, wherein the step of recessing the portion of the semiconductor substrate comprises etching the portion of the semiconductor substrate using an etching solution comprising Tetra-Methyl Ammonium Hydroxide (TMAH), and wherein a concentration of the TMAH is between about 5 percent and about 95 percent.

12. The method of claim 9 further comprising, after the annealing, recessing the isolation regions, wherein after the recessing the isolation regions, top surfaces of remaining portions of the isolation regions are higher than a top edge of the slant surface.

13. The method of claim 12, wherein after the step of recessing the isolation regions, a portion of the semiconductor material higher than top surfaces of remaining portions of the isolation regions forms a semiconductor fin, and wherein the method further comprises:
    forming a gate dielectric on sidewalls and a top surface of the semiconductor fin;
    forming a gate electrode on the gate dielectric; and
    forming a source region and a drain region on opposite sides of the gate electrode, with each of the source region and the drain region comprising a portion of the semiconductor material.

14. The method of claim 12, wherein after the step of recessing the isolation regions, top surfaces of remaining portions of the isolation regions are higher than a top edge of the slant surface.

15. A method comprising:
    recessing a portion of a semiconductor substrate between opposite isolation regions to form a recess, wherein after the step of recessing, the portion of the semiconductor substrate comprises a top surface comprising:
- a flat surface; and
- a slant surface having a (111) surface plane, wherein the slant surface comprises a bottom edge connected to the flat surface, and a top edge, wherein the top edge is at a first depth of the recess, and the bottom edge is at a second depth of the recess;

performing an epitaxy to grow a semiconductor material in the recess, with the semiconductor material comprising silicon germanium, wherein the semiconductor material is grown from the flat surface and the slant surface;

performing a planarization to level a top surface of the semiconductor material with top surfaces of the isolation regions; and after the planarization, performing an annealing on the semiconductor material, wherein the annealing is performed at a temperature between about 800° C. and about 900° C., with nitrogen ($N_2$) as a process gas of the annealing.

16. The method of claim 15, wherein the step of recessing the portion of the semiconductor substrate comprises etching the portion of the semiconductor substrate using an etching solution comprising Tetra-Methyl Ammonium Hydroxide (TMAH), and wherein a concentration of the TMAH is lower than about 30 percent.

17. The method of claim 15 further comprising, after the annealing, recessing the isolation regions, wherein after the recessing the isolation regions, top surfaces of remaining portions of the isolation regions are higher than the top edge of the slant surface.

18. The method of claim 17, wherein after the step of recessing the isolation regions, top surfaces of remaining portions of the isolation regions are higher than the top edge of the slant surface.

19. The method of claim 17, wherein after the step of recessing the isolation regions, at least a portion of the semiconductor material higher than top surfaces of remaining portions of the isolation regions forms a semiconductor fin, and wherein the method further comprises:
- forming a gate dielectric on sidewalls and a top surface of the semiconductor fin;
- forming a gate electrode on the gate dielectric; and
- forming a source region and a drain region on opposite sides of the gate electrode, with each of the source region and the drain region comprising a portion of the semiconductor material.

* * * * *